(12) United States Patent
Van Den Nieuwelaar et al.

(10) Patent No.: US 10,627,721 B2
(45) Date of Patent: Apr. 21, 2020

(54) LITHOGRAPHY APPARATUS, AND A METHOD OF MANUFACTURING A DEVICE

(71) Applicant: ASML NETHERLANDS B.V., Veldhoven (NL)

(72) Inventors: Norbertus Josephus Martinus Van Den Nieuwelaar, Tilburg (NL); Victor Manuel Blanco Carballo, Eindhoven (NL); Thomas Augustus Mattaar, Veldhoven (NL); Johannes Cornelis Paulus Melman, Oisterwijk (NL); Gerben Pieterse, Eindhoven (NL); Johannes Theodorus Guillielmus Maria Van De Ven, Eindhoven (NL); Jan-Piet Van De Ven, Veldhoven (NL); Petrus Franciscus Van Gils, Rijen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/768,446

(22) PCT Filed: Aug. 22, 2016

(86) PCT No.: PCT/EP2016/069794
§ 371 (c)(1),
(2) Date: Apr. 13, 2018

(87) PCT Pub. No.: WO2017/054987
PCT Pub. Date: Apr. 6, 2017

(65) Prior Publication Data
US 2018/0321592 A1    Nov. 8, 2018

(30) Foreign Application Priority Data

Oct. 1, 2015   (EP) .................................... 15187981

(51) Int. Cl.
G03B 27/52  (2006.01)
G03B 27/42  (2006.01)
G03F 7/20   (2006.01)

(52) U.S. Cl.
CPC ...... *G03F 7/70341* (2013.01); *G03F 7/70725* (2013.01)

(58) Field of Classification Search
CPC combination set(s) only.
See application file for complete search history.

(56) References Cited

U.S. PATENT DOCUMENTS 6,952,253 B2   10/2005   Lof et al.
7,679,719 B2    3/2010   Van Den Biggelaar
(Continued)

FOREIGN PATENT DOCUMENTS

CN   1952786    4/2007
CN   101464636  6/2009
(Continued)

OTHER PUBLICATIONS

International Search Report and Written Opinion dated Nov. 28, 2016 in corresponding International Patent Application No. PCT/EP2016/069794.
(Continued)

*Primary Examiner* — Mesfin T Asfaw
(74) *Attorney, Agent, or Firm* — Pillsbury Winthrop Shaw Pittman LLP

(57) ABSTRACT

A route for a substrate support that supports a substrate in an immersion lithographic apparatus is calculated to satisfy the following constraints: after the edge of the substrate first contacts the immersion space, the substrate remains in contact with the immersion space until all target portions are exposed; exposures of target portions are performed while the substrate moves in a scan direction; and all movements
(Continued)

of the substrate between exposures are, in a plane parallel to its upper surface, either curved or only in one of the scan directions or transverse directions. In order to reduce exposure defects at the edge of the substrate the outside portion of the substrate is avoided from being exposed to the immersion liquid. The transfer routes are designed to overly the substrate surface.

23 Claims, 9 Drawing Sheets

(56) References Cited

U.S. PATENT DOCUMENTS

| | | | |
|---|---|---|---|
| 9,329,491 | B2 | 5/2016 | Grouwstra et al. |
| 2004/0207824 | A1 | 10/2004 | Lof et al. |
| 2007/0090301 | A1 | 4/2007 | Van Empel et al. |
| 2007/0109513 | A1 | 5/2007 | Leenders et al. |
| 2007/0188733 | A1 | 8/2007 | Ito et al. |
| 2008/0246934 | A1 | 10/2008 | Van Den Biggelaar |
| 2009/0161089 | A1 | 6/2009 | Leenders et al. |
| 2009/0257034 | A1* | 10/2009 | Kuit .................. G03F 7/70533 355/53 |
| 2010/0214543 | A1 | 8/2010 | Stavenga et al. |
| 2012/0003381 | A1 | 1/2012 | Grouwstra et al. |
| 2012/0162619 | A1 | 6/2012 | Sato |
| 2012/0218534 | A1 | 8/2012 | Mulder et al. |
| 2014/0307235 | A1 | 10/2014 | Sato |
| 2015/0109590 | A1 | 4/2015 | Xie et al. |

FOREIGN PATENT DOCUMENTS

| | | |
|---|---|---|
| EP | 1 420 298 | 5/2004 |
| EP | 1 804 121 | 7/2007 |
| JP | 2007142428 | 6/2007 |
| JP | 2007194484 | 8/2007 |
| JP | 2008091424 | 4/2008 |
| JP | 2009081479 | 4/2009 |
| JP | 2010219510 | 9/2010 |
| JP | 2011258602 | 12/2011 |
| JP | 2012178563 | 9/2012 |
| JP | 2013-235922 | 11/2013 |
| JP | 2014503980 | 2/2014 |
| JP | 2015-204323 | 11/2015 |
| WO | 2006106832 | 10/2006 |
| WO | 2014057926 | 4/2014 |
| WO | 2016/020121 | 2/2016 |

OTHER PUBLICATIONS

Taiwan Office Action dated Jun. 30, 2017 in corresponding Taiwan Patent Application No. 105129731.
Japanese Office Action issued in corresponding Japanese Patent Application No. 2018-511669, dated Mar. 19, 2019.
Chinese Office Action issued in corresponding PCT Patent Application No. 201680057802.3, dated Nov. 1, 2019.

* cited by examiner

LITHOGRAPHY APPARATUS, AND A METHOD OF MANUFACTURING A DEVICE

This application is the U.S. national phase entry of PCT patent application no. PCT/EP2016/069794, which was filed on Aug. 22, 2016, which claims the benefit of priority of European patent application no. 15187981.4, which was filed on Oct. 1, 2015.

FIELD

The present invention relates to a lithography apparatus, a method of manufacturing a device using a lithography apparatus, and a control program for a lithography apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Immersion techniques have been introduced into lithographic systems to enable improved resolution of smaller features. In an immersion lithographic apparatus, a liquid layer of a liquid having a relatively high refractive index is interposed in a space between a projection system of the apparatus (through which the patterned beam is projected towards the substrate) and the substrate. The liquid covers at last the part of the wafer under the final lens element of the projection system. Thus, at least the portion of the substrate undergoing exposure is immersed in the liquid. The effect of the immersion liquid is to enable imaging of smaller features since the exposure radiation will have a shorter wavelength in the liquid than gas. (The effect of the liquid may also be regarded as increasing the effective numerical aperture (NA) of the system and also increasing the depth of focus.)

In commercial immersion lithography, the liquid is water. Typically the water is distilled water of high purity, such as Ultra-Pure Water (UPW) which is commonly used in semiconductor fabrication plants. In an immersion system, the UPW is often purified and it may undergo additional treatment steps before supply to the immersion space as immersion liquid. Other liquids with a high refractive index can be used besides water can be used as the immersion liquid, for example: a hydrocarbon, such as a fluorohydrocarbon; and/ or an aqueous solution. Further, other fluids besides liquid have been envisaged for use in immersion lithography.

In this specification, reference will be made in the description to localized immersion in which the immersion liquid is confined, in use, to the space between the final lens element and a surface facing the final element. The facing surface is a surface of substrate or a surface of the supporting stage (or substrate table) that is co-planar with the substrate surface. (Please note that reference in the following text to surface of the substrate W also refers in addition or in the alternative to a surface of the substrate table, unless expressly stated otherwise; and vice versa). A fluid handling structure present between the projection system and the stage is used to confine the immersion to the immersion space.

The space filled by liquid is smaller in plan than the top surface of the substrate and the space remains substantially stationary relative to the projection system while the substrate and substrate stage move underneath.

SUMMARY

Defects in the pattern applied to the substrate are undesirable as they reduce the yield, i.e. the number of usable devices per substrate. Since many patterning steps are required to make a device, even a very low rate of defects per exposure can significantly reduce the yield. There are two types of defect that are peculiar to an immersion lithography apparatus. The rate of defects can increase if the speed of movement of the substrate relative to the immersion space increases.

A droplet of liquid or a liquid film (hereinafter reference to a droplet also encompasses a film; a film being a droplet covering a larger surface area) from the immersion space may be left on the substrate after exposure of a target portion. If the droplet is in contact with the resist for a significant period it can degrade the resist. If the droplet evaporates, it can leave behind debris. Defects resulting from droplets left on the substrate, whether by resist degradation or evaporation, are referred to herein as trail defects.

A second form of defect peculiar to an immersion lithography apparatus occurs if a bubble is formed in the immersion liquid. If the bubble moves into the path of a projection beam used to project the image of the patterning device onto the substrate, then the projected image will be distorted. Defects caused by bubbles are referred to herein as expose defects.

It is desirable, for example, to provide a system to reduce the effects of defects peculiar to an immersion lithography apparatus and/or to increase the throughput of an immersion liquid apparatus.

According to an aspect of the invention, there is provided a lithographic apparatus for exposing a patterned beam onto target portions of a substrate, the apparatus comprising:

a projection system configured to project a patterned beam and having a final optical element;

a substrate support configured to support a substrate in the patterned beam;

a liquid confinement structure configured to confine a liquid to an immersion space between the final optical element and the substrate;

a positioning device configured to position the substrate support and thereby the substrate; and a controller configured to control the positioning device so that the substrate support follows a route comprising:

a first exposure motion during which the substrate is moved at a constant speed in a first direction;

a first transit motion during which the substrate is accelerated in a second direction orthogonal to the first direction and decelerated in the first direction;

a second transit motion during which the substrate's motions in a plane containing the first and second directions are only in the second direction;

a third transit motion during which the substrate accelerates in the first direction and decelerates in the second direction;

a fourth transit motion in which the substrate's movements in the plane containing the first and second directions are only parallel to the first direction; and a second exposure motion during which the substrate is moved at a constant speed in a direction parallel to the first direction.

According to an aspect of the invention, there is provided a method of manufacturing a device using a lithographic apparatus for exposing a patterned beam onto target portions of a substrate, the apparatus comprising:

a projection system configured to project a patterned beam and having a final optical element;

a substrate support configured to support a substrate in the patterned beam;

a liquid confinement structure configured to confine a liquid to an immersion space between the final optical element and the substrate; and a positioning device configured to position the substrate support and thereby the substrate; the method comprising:

a first exposure motion during which the substrate is moved at a constant speed in a first direction;

a first transit motion during which the substrate is accelerated in a second direction orthogonal to the first direction and decelerated in the first direction;

a second transit motion during which the substrate's movements in a plane containing the first and second directions are only in the second direction;

a third transit motion during which the substrate accelerates in the first direction and decelerates in the second direction;

a fourth transit motion in which the substrate's movements in a plane containing the first and second directions are only parallel to the first direction; and a second exposure motion during which the substrate is moved at a constant speed in a direction parallel to the first direction.

According to an aspect of the invention, there is provided a computer program for calculating a route for a substrate support that supports a substrate in a lithographic apparatus having a liquid confinement structure configured to confine a liquid to an immersion space adjacent the substrate and a drive system for positioning the substrate in first to fourth directions, the first direction being perpendicular to the second direction, the third direction being opposite to the first direction and the fourth direction being opposite to the second direction, the route enabling exposure of a plurality of target portions on the substrate and the computer program comprising code that, when executed by a processor, calculates a route that satisfies the following constraints:

after the edge of the substrate first contacts the immersion space, the substrate remains in contact with the immersion space until all target portions are exposed;

exposures of target portions are performed whilst the substrate moves in the first direction or the third direction; and all movements of the substrate between exposures are, in a plane containing the first and second directions, either curved or only in one of the first to fourth directions.

According to an aspect of the invention, there is provided a computer program for calculating a route for a substrate support that supports a substrate in a lithographic apparatus having a liquid confinement structure configured to confine a liquid to an immersion space adjacent the substrate and a positioning system for positioning the substrate in first to fourth directions, the first direction being perpendicular to the second direction, the third direction being opposite to the first direction and the fourth direction being opposite to the second direction, the route enabling exposure of a plurality of target portions on the substrate and the computer program comprising code that, when executed by a processor, calculates a route that satisfies the following constraints:

exposures of target portions are performed whilst the substrate moves in the first direction or the third direction;

all movements of the substrate between exposures are, in a plane containing the first and second directions, either curved or only in one of the first to fourth directions; and all movements of the substrate in a plane parallel to its upper surface are limited to a speed less than or equal to a predetermined maximum speed irrespective of the direction thereof.

According to an aspect of the invention, there is provided a lithographic apparatus for exposing a patterned beam onto target portions of a substrate, the apparatus comprising:

a projection system configured to project a patterned beam and having a final optical element;

a substrate support configured to support a substrate in the patterned beam;

a liquid confinement structure configured to confine a liquid to an immersion space between the final optical element and the substrate;

a positioning device configured to position the substrate support and thereby the substrate in first to fourth directions, the first direction being perpendicular to the second direction, the third direction being opposite to the first direction and the fourth direction being opposite to the second direction; and a controller configured to control the positioning device so that the substrate support follows a route comprising:

a first extended linear motion during which the substrate is moved at a constant speed in one of the first to fourth directions;

a first curved motion during which the substrate is moved along a curved path;

a first short linear motion during which the substrate is moved at a constant speed in one of the first to fourth directions, the second short linear motion being shorter than the first extended linear motion;

a second curved motion during which the substrate is moved along a curved path;

a second short linear motion during which the substrate is moved at a constant speed in one of the first to fourth directions, the second short linear motion being shorter than the first extended linear motion;

a third curved motion during which the substrate is moved along a curved path; and a second extended linear motion during which the substrate is moved at a constant speed in one of the first to fourth directions, the second extended linear motion being longer than each of the first and second short linear motions;

wherein the speed of the substrate during at least a part of each of the first and second curved motions is greater than the speed of the substrate during the first and second extended linear motions.

A lithographic apparatus for exposing a patterned beam onto target portions of a substrate, the apparatus comprising:

a projection system configured to project a patterned beam and having a final optical element;

a substrate support configured to support a substrate in the patterned beam; a liquid confinement structure configured to confine a liquid to an immersion space between the final optical element and the substrate;

a positioning device configured to position the substrate support and thereby the substrate in first to fourth directions, the first direction being perpendicular to the second direction, the third direction being opposite to the first direction and the fourth direction being opposite to the second direction; and a controller configured to control the positioning device so that the substrate support follows a route comprising:

a first extended linear motion during which the substrate is moved at a constant speed in one of the first to fourth directions;

a second extended linear motion during which the substrate is moved at a constant speed in one of the first to fourth directions;

between the first extended linear motion and the second extended linear motion, a series of curved motions, during which the substrate is moved along respective curved paths, the speed of the substrate during at least a part of each of the curved motions is greater than the speed of the substrate during the first and second extended linear motions.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
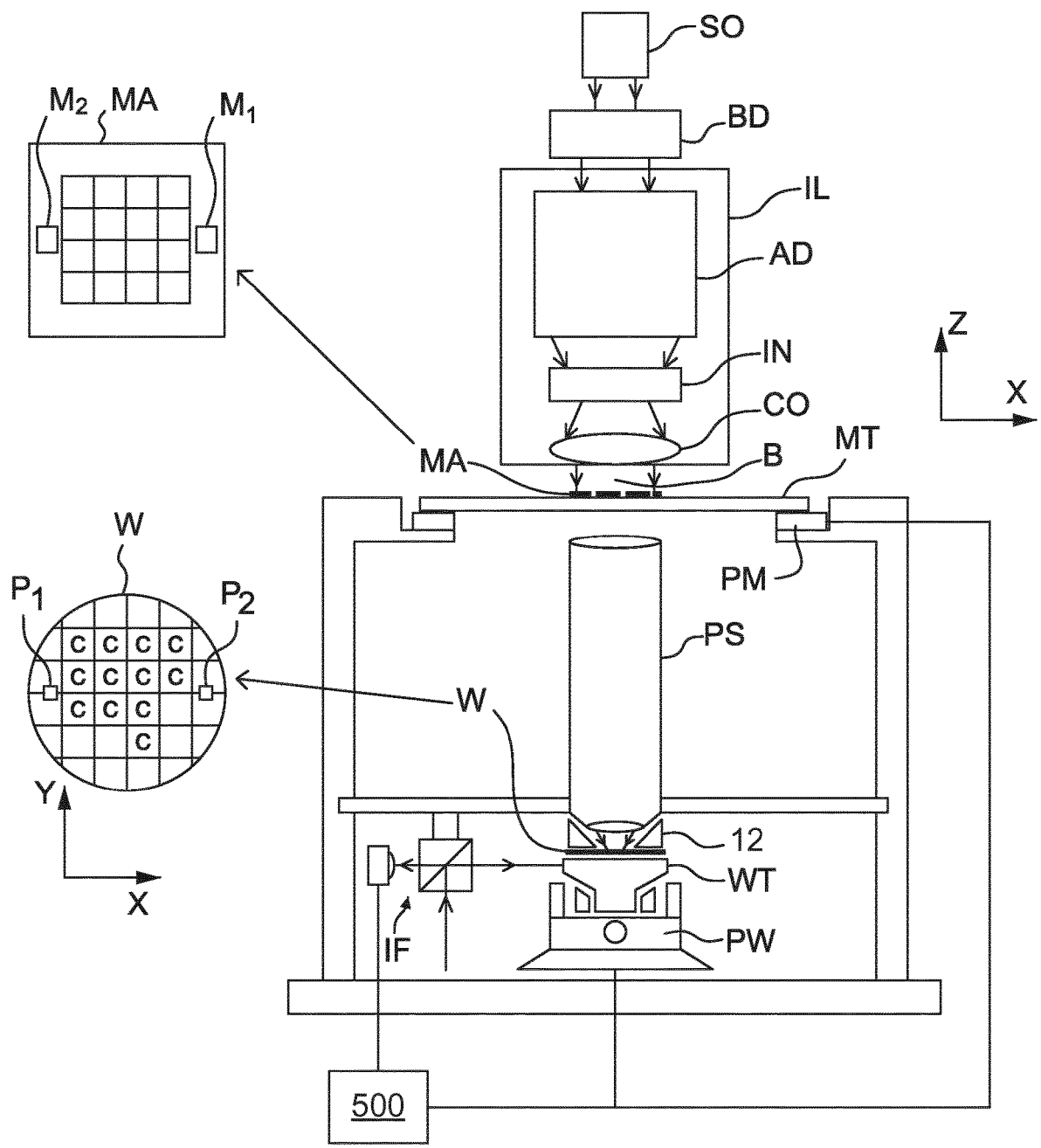
FIG. 1 schematically depicts a lithographic apparatus according to an embodiment.

FIG. 1 schematically depicts a lithographic apparatus according to an embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable minor array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing minors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan.

In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab.

Arrangements for providing liquid between a final lens element of the projection system PS and the substrate can be classed into three general categories. These are the bath type arrangement, the so-called localized immersion systems and the all-wet immersion systems. The present invention relates particularly to the localized immersion systems.

In an arrangement which has been proposed for a localized immersion system, a liquid confinement structure 12 extends along at least a part of a boundary of an immersion space between the final lens element of the projection system PS and the facing surface of the stage or table facing the projection system. The facing surface of the table is referred to as such because the table is moved during use and is rarely stationary. Generally, the facing surface of the table is a surface of a substrate W, substrate table WT which surrounds the substrate or both.

In an embodiment, the liquid confinement structure 12 as illustrated in FIG. 1 may extend along at least a part of a boundary of the immersion space between the final lens element 100 of the projection system PS and the substrate table WT or substrate W. In an embodiment, a seal is formed between the liquid confinement structure 12 and the surface of the substrate W/substrate table WT. The seal may be a contactless seal such as a gas seal 16 or an immersion liquid seal. (A system with a gas seal is disclosed in European patent application publication no. EP-A-1,420,298 which is hereby incorporated by reference in its entirety).

The liquid confinement structure 12 is configured to supply and confine immersion liquid to the immersion space. Liquid may be brought into the immersion space by a liquid inlet and the liquid may be removed by a liquid outlet.

The liquid may be confined in the immersion space by a gas seal. In use the gas seal is formed between the bottom of the liquid confinement structure 12 and the facing surface of the table (i.e. the surface of the substrate W and/or the surface of the substrate table WT). The gas in the gas seal is provided under pressure via an inlet to a gap between the liquid confinement structure 12 and substrate W and/or substrate table WT. The gas is extracted via a channel associated with an outlet. The overpressure on the gas inlet, vacuum level on the outlet and geometry of the gap are arranged so that there is a high-velocity gas flow inwardly that confines the liquid. The force of the gas on the liquid between the liquid confinement structure 12 and the substrate W and/or substrate table WT confines the liquid in the immersion space 10. Such a system is disclosed in U.S. patent application publication no. US 2004-0207824 which is hereby incorporated by reference in its entirety.

Figure 3:
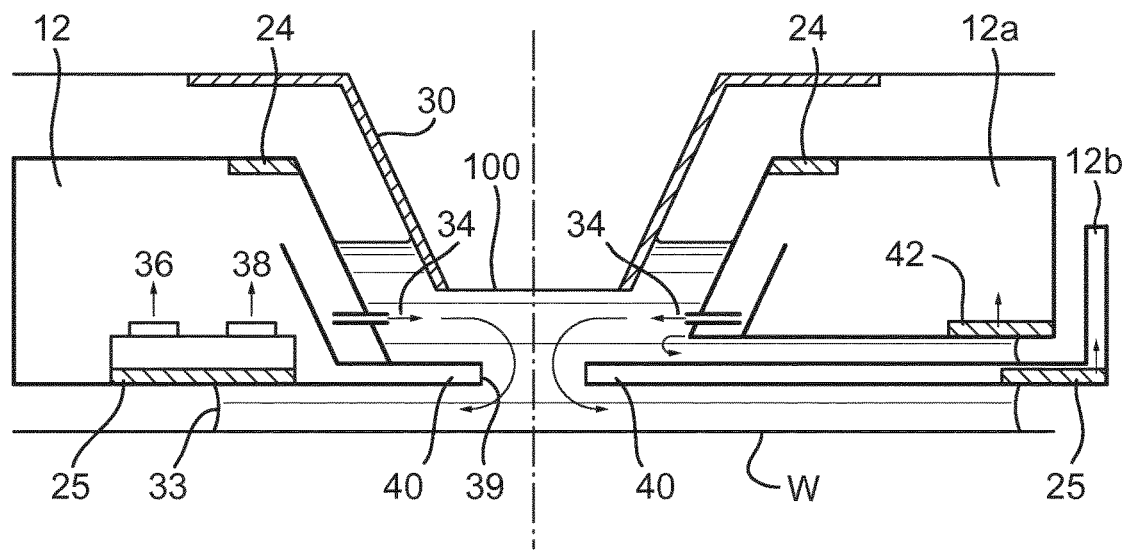
FIG. 3 is a side cross sectional view that schematically depicts two further immersion liquid confinement structure arrangements for use in a lithographic projection apparatus according to an embodiment.

Other immersion liquid confinement structures 12 can be used with embodiments of the present invention, such the arrangement depicted in FIG. 3.

Figure 2:
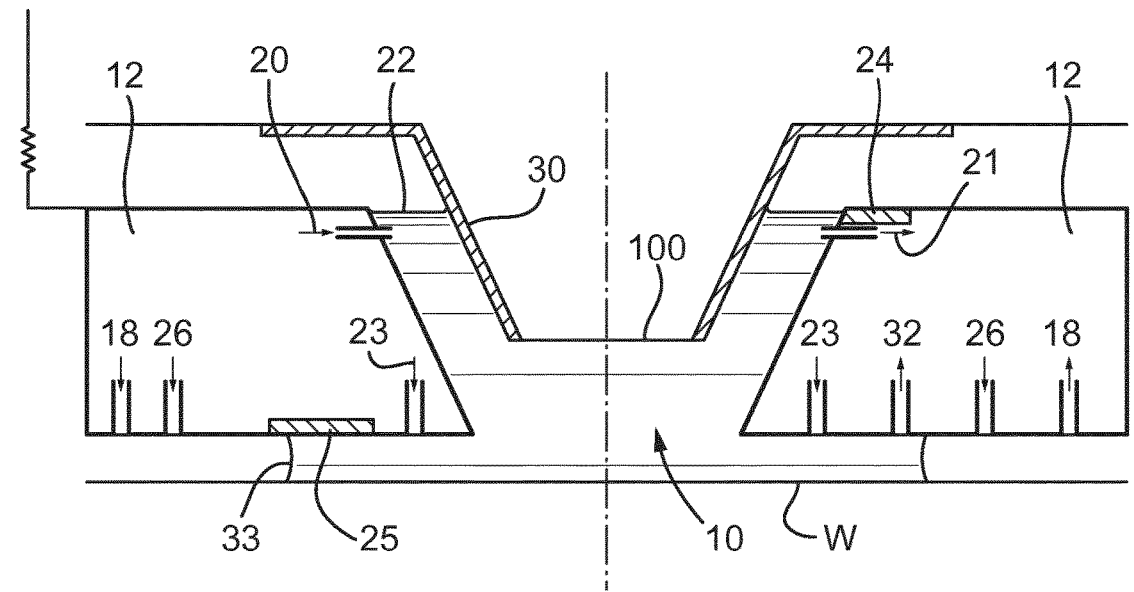
FIG. 2 schematically depicts two immersion liquid confinement structure arrangements for use in a lithographic projection apparatus according to an embodiment.

FIGS. 2 and 3 show different features which may be present in variations of the liquid confinement structure 12. The arrangements illustrated in FIG. 2 and described below may be applied to the lithographic apparatus described above and illustrated in FIG. 1. Each figure shows two different arrangements of features of a liquid confinement structure on the bottom left-hand-side and bottom right-hand side of the figure, respectively. Unless mentioned otherwise, the two designs share common features. The designs may share some of the same features as described above unless described differently. The features described herein may be selected individually or in combination as shown or as required.

FIG. 2 shows a confinement structure 12 around the bottom surface of a last lens element. The last lens element 100 has an inverted frustro-conical shape. The frustro-conical shape having a planar bottom surface and a conical surface. The frustro-conical shape protrudes from a planar surface and having a bottom planar surface. The bottom planar surface is the optically active portion of the bottom surface of the last lens element, through which the projection beam may pass. The confinement structure surrounds at least part of the frustro-conical shape. The confinement structure has an inner-surface which faces towards the conical surface of the frustro-conical shape. The inner-surface and the conical surface have complementary shape. A top surface of the confinement structure is substantially planar. The confinement structure may fit around the frustro-conical shape of the last lens element. A bottom surface of the liquid confinement structure is substantially planar and in use the bottom surface may be parallel with the facing surface of the table and/or wafer. The distance between the bottom surface and the facing surface may be in the range of 30 to 500 micrometers, desirably in the range of 80 to 200 micrometers.

The liquid confinement structure 12 extends closer to the facing surface of the wafer W and wafer table WT than the last lens element 100. An immersion space 10 is therefore defined between the inner surface of the liquid confinement structure 12, the planar surface of the frustro-conical portion and the facing surface. During use, the immersion space 10 is filled with liquid. The liquid fills at least part of a buffer space between the complementary surfaces between lens and the liquid confinement structure 12, in an embodiment at least part of the immersion space 10 between the complementary inner-surface and the conical surface.

Liquid is supplied to the immersion space 10 through an opening formed in the surface of the liquid confinement structure 12. The liquid may be supplied through a supply opening 20 in the inner-surface of the liquid confinement structure. Alternatively or additionally, the liquid is supplied from an under supply opening 23 formed in the undersurface of the liquid confinement structure 12. The under supply opening may surround the path of the projection beam and it may be formed of a series of openings in an array. The liquid is supplied to fill the immersion space 10 so that flow through the space under the projection system is laminar The supply of liquid from the under supply opening 23 under the liquid confinement structure 12 additionally prevents the ingress of bubbles into the immersion space 10. This supply of liquid functions as a liquid seal.

The liquid may be recovered from a recovery opening 21 formed in the inner-surface. The recovery of the liquid through the recovery opening 21 may be by application of an under pressure; the recovery through the recovery opening 21 may be a consequence of the velocity of the liquid flow through the space; or the recovery may be as a consequence of both. The recovery opening 21 may be located on the opposite side of the supply opening 20, when viewed in plan. Additionally or alternatively, the liquid may be recovered through an overflow opening 24 located on the top surface of the liquid confinement structure 12, as shown in the right-hand arrangement. Note that if present the overflow may extend around the top of the liquid confinement structure, around the path of the projection beam.

Additionally or alternatively, liquid may be recovered from under the liquid confinement structure 12 through a bottom recovery opening 25, 32. A meniscus 33 forms between the liquid confinement structure 12 and the facing surface and it serves as border between the liquid space and the gaseous external environment. The bottom recovery opening may be a porous plate 25 which may recover the liquid in a single phase flow. The meniscus may be free to move over the surface of the porous plate during relative movement of facing surface relative to the liquid confinement structure. Alternatively, the bottom recovery opening 25, may serve to hold (or 'pin') the liquid meniscus 33 to the liquid confinement structure 12. The bottom recovery opening may be a series of pining openings 32 through which the liquid is recovered. The pining openings 32 may recover the liquid in a two phase flow.

Optionally radially outward, with respect to the inner-surface of the liquid confinement structure 12, is an gas knife opening 26. Gas may be supplied through the gas knife opening 26 at elevated speed to assist confinement of the immersion liquid in the immersion space 12. The supplied gas may be humidified and it may contain carbon dioxide. The supplied gas may consist essentially of carbon dioxide and water vapor. Radially outward of the gas knife opening 26 is a gas recovery opening 18 for recovering the gas supplied through the gas knife opening 26.

FIG. 3 depicts two further arrangements of liquid confinement structure 12. The two different arrangements are shown for features on the bottom left-hand-side and bottom right-hand side of the figure, respectively. Unless mentioned otherwise, the two designs share common features. Features of the two arrangements shown in FIG. 3 which are common to FIG. 2 share the same reference numbers. The liquid confinement structure 12 has an inner surface which complements the conical surface of the frustro-conical shape. The undersurface of the liquid confinement structure 12 is closer to the facing surface than the bottom planar surface of the frustro-conical shape.

Liquid is supplied to the immersion space 10 through supply openings formed in the inner surface of the liquid confinement structure 12. The supply openings 34 are located towards the bottom of the inner surface, perhaps below the bottom surface of the fustro-conical shape. The supply openings 34 are located on an inner surface, spaced apart around the path of the projection beam.

Liquid is recovered from the immersion space 10 through recovery openings 25 in the undersurface of the liquid confinement structure 12. As the facing surface moves under the liquid confinement structure 12, the meniscus 33 may migrate over the surface of the recovery opening 25 in the same direction as the movement of the facing surface. The recovery openings 25 may be formed of a porous member. The liquid may be recovered in single phase. In an embodiment the liquid is recovered in a two phase flow. The two phase flow is received in a chamber 35 within the liquid confinement structure 12 where it is separated into liquid and gas. The liquid and gas are recovered through separate channels 36, 38 from the chamber 35.

An inner periphery 39 of the undersurface of the liquid confinement structure 12 extends into the space away from the inner surface to form a plate 40. The inner periphery forms a small aperture which may be sized to match the shape and size of the projection beam. The plate may serve to isolate liquid either side of it. The supplied liquid flows inwards towards the aperture, through the inner aperture and then under the plate radially outwardly towards the surrounding recovery openings 25.

In an embodiment the liquid confinement structure 12 may be in two parts: an inner part 12a and an outer part 12b. For convenience this arrangement is shown in the right-hand part of FIG. 3. The two parts may move relatively to each other, in a plane parallel to facing surface. The inner part may have the supply openings 34 and it may have the overflow recovery 24. The outer part 12b may have the plate 40 and the recovery opening 25. The inner part may have an intermediate recovery 42 for recovering liquid which flows between the two parts.

In order to reduce or minimize the cost of ownership of a lithography apparatus, it is desirable to maximize throughput, that is the rate at which substrates are exposed, and yield, that is the proportion of exposed devices that function correctly. Since many exposure steps may be required to create a device, even a low rate of defects per exposure may result in a significant reduction of yield.

The frequency of occurrence of both trail defects and expose defects tends to increase as the speed of relative motion between the substrate table WT and the liquid confinement structure 12 increases. The speed of relative motion during a scanned exposure is referred to as the scan speed. An increase in the scan speed is desirable to increase throughput. An increase in scan speed may lead to an increase in defects because it is more difficult to effectively confine the immersion liquid to the immersion space 10. Trail defects and expose defects tend not to be randomly or uniformly distributed across the area of exposed substrates but occur with higher probability in certain locations. The distribution of trail defects and expose defects may vary according to the exposure recipe, in particular according to the order of exposure of target portions. To reduce the occurrence of defects, the scan speed may be reduced when exposing certain target portions of a substrate. However a reduction of scan speed is undesirable as it reduces throughput.

It should be noted that in a lithography apparatus it is normally the substrate table WT that moves while the projection system PS and liquid confinement structure 12 are stationary. However it is often convenient to describe motions of the substrate table WT as if the substrate table WT is stationary and the projection system PS and liquid confinement structure 12 move. An embodiment of the invention applies whether the substrate table WT and/or the projection system PS/liquid confinement structure 12 move.

The lithography apparatus may be provided with measures to prevent the formation of bubbles, to prevent bubbles straying into the path of the projection beam or to remove bubbles from the immersion space 10. Such measures may not be wholly effective. A bubble will in time be removed from the immersion space 10 or the gas within it may dissolve into the immersion liquid, but a bubble may still stray into the projection beam during an exposure and cause a defect. The defect may occur at an unpredictable location in any of the first few target portions that are exposed after formation of the bubble. It is therefore difficult to determine the cause of an expose defect; in particular it can be difficult to determine when a bubble that caused a particular expose defect was created.

To expose a series of target portions, an exposure route is typically calculated in advance. The exposure route includes scanning motions of the substrate table WT for each target portion to be exposed and transfer motions between scanning motions to line up the substrate table WT for the next scanning motion. Conventionally, each target portion in a column of target portions extending in a non-scan direction, e.g. the X direction, is exposed in turn. During the exposure, the substrate table moves in a scan direction, e.g. the +Y direction, which is substantially perpendicular to the non-scan direction, or a reverse scan direction, e.g. the -Y direction. Exposures in a sequence alternate between the scan direction and the reverse scan direction. The exposure motions and the transfer motions therefore together form a meander route. The exposure route may also include motions to perform measurements before, during, or after a sequence of exposures. During an exposure route, the substrate W may move completely out from underneath the liquid confinement structure 12 so that the immersion liquid does not overlap the substrate W. This occurs in particular when exposing an edge target portion. A movement of the substrate table WT to bring the substrate W underneath the immersion space 10, i.e. the movement during which the substrate edge crosses the meniscus 17 is referred to as an entry motion.

Edge target portions are target portions which intersect the substrate edge so that the target portion is not complete. When rectangular target portions are overlaid on a circular substrate it is inevitable that there will be some target portions that intersect the substrate edge and are incomplete. Edge target portions are conventionally exposed for two reasons. Firstly, if the pattern to be exposed includes a plurality of devices, i.e. the devices are smaller than the target portions, then it is possible that the edge target portion will include whole devices. Secondly, if the edge target portions are not exposed, a level difference between unexposed edge target portions and exposed non-edge target portions can arise through process steps such as etching or deposition. Such a level difference means that the target portions next to the unexposed edge target portions experience a different environment than target portions not next to the unexposed edge portions during process steps and so devices may not be formed correctly. Also, stresses can arise in the substrate.

In a lithographic apparatus, a speed limit may be defined, which is referred to herein as the maximum immersion speed $v_{max}$. The maximum immersion speed can be applied during generation of a route for exposure of a substrate. The maximum immersion speed can be applied after a route has been generated. The maximum immersion speed is defined as the speed of relative movement between the substrate and the immersion space at which the risk of defects, especially trail defects, becomes unacceptable. The maximum immersion speed can be determined theoretically or empirically. The maximum immersion speed can be a preset value for a given lithographic apparatus. The maximum immersion speed can be a variable dependent on one or more parameters of the lithographic apparatus or an exposure recipe, such as the rate of operation of a part of the liquid confinement system or the type of radiation-sensitive layer (e.g. resist) in use. The maximum immersion speed can be a user-determined value. The maximum immersion speed may be greater than a scan speed used during exposures so that speed limiting only applies during transfer moves between exposures.

A lithographic apparatus may have two independent drives for positioning the substrate support in two orthogonal directions, e.g. parallel to the X axis and parallel to the Y axis. The Y axis may be the direction in which exposure scans are performed and can be referred to as the scan direction. In order to reduce the amount of calculation required, set-points defining a route may be independently generated in the X and Y directions. Speed limitation can be applied using a process of co-ordinate transformation as described in U.S. Pat. No. 7,679,719 B2, which document is hereby incorporated by reference in its entirety.

Figure 4:
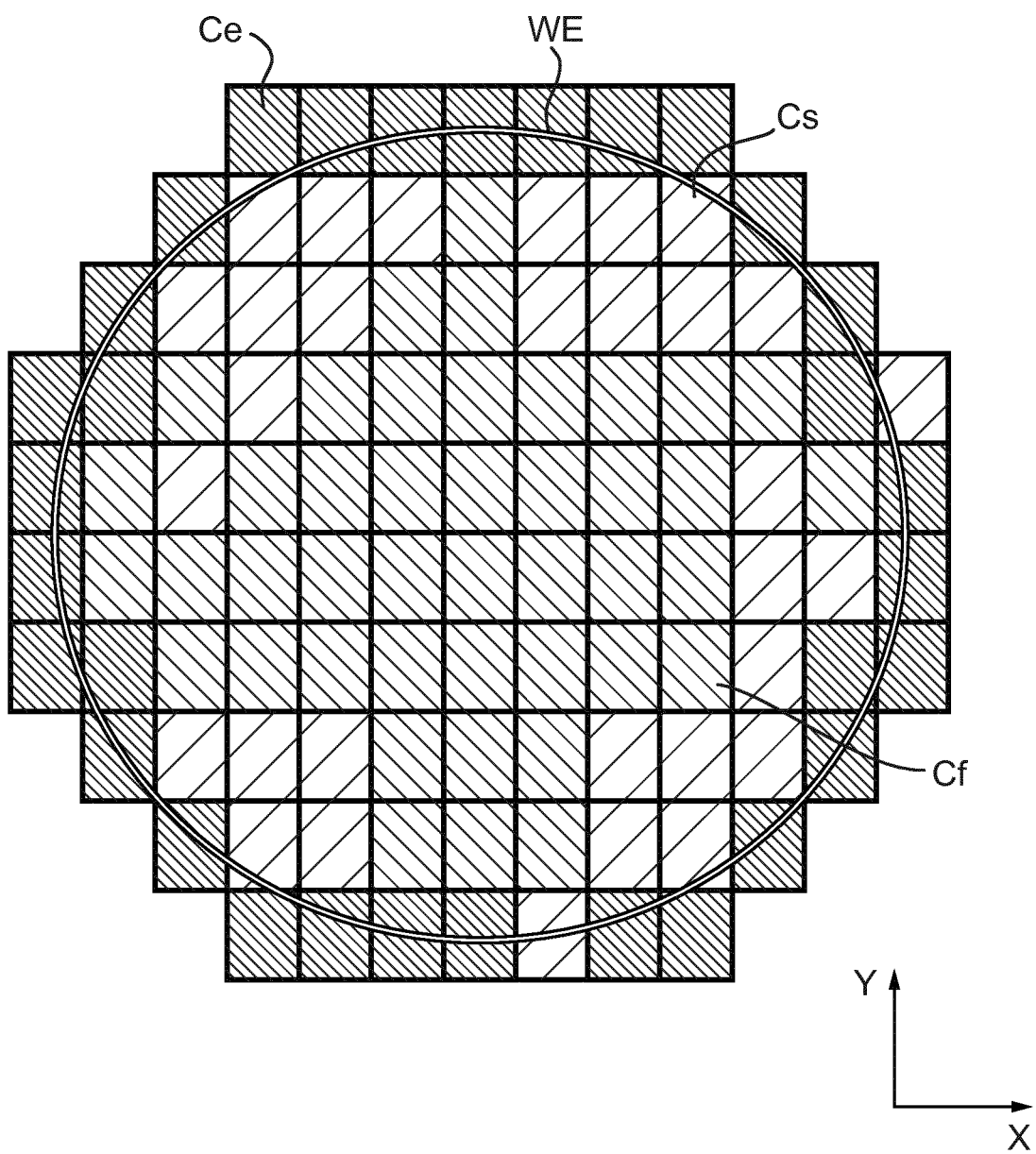
FIG. 4 depicts an arrangement of target portions on a substrate and different scanning speeds applied.

FIG. 4 depicts an arrangement of 110 target portions overlaid on a substrate W. Other arrangements of target portions are possible. It will be seen that 42 target portions Ce intersect the substrate edge WE; these are edge target portions. About 30 target portions, including some edge target portions, are exposed at a slower scan speed to minimize defects. These are denoted Cs and indicated by less dense hatching. The slower scan speed can be about 50% of the scan speed at which other target portions Cf are exposed. It can therefore be seen that performing exposures at a slower scan speed to reduce formation of defects can cause a significant reduction in throughput.

A higher rate of expose defects is associated with motions of the substrate that cause the immersion space 10 to leave the substrate completely. The rate of defects can be particularly high if the trailing boundary of the immersion liquid, e.g. the meniscus of the immersion liquid, is approximately parallel to the substrate edge WE when the immersion space leaves the substrate. This can occur in a conventional turnaround motion after exposure of an edge target portion with the substrate moving in a direction such that the substrate is moving out from under the immersion space when the substrate must be moved further in that direction to line up for exposure of the next target portion. In the conventional turnaround motion, the substrate continues to move in the expose direction, e.g. +Y, until it has nearly gone as far as necessary to line for the next exposure, then it decelerates in the Y direction whilst accelerating in a perpendicular direction, e.g. −X, so as to move across for the next exposure. Having reached a speed of 0 in the Y direction the substrate moves in a straight line in the −X direction until it nears the line of the next exposure. The substrate then decelerates in the X direction whilst accelerating in the direction of the next exposure. This movement can be optimized for speed by maximizing the magnitudes of the accelerations and decelerations. The resulting route resembles a grid plan: the substrate mostly moves in directions parallel to the X & Y axes with tight curved transitions (referred to herein as curved motions) between directions of movement.

To avoid the immersion space 10 leaving the substrate a modified turnaround motion has been proposed. Turnaround motion R21, shown in FIG. 5 by a dot-chain line, avoids moving the substrate W wholly out from underneath the immersion space 10. Turnaround motion R21 ensures that a part of the substrate W always partially overlaps the immersion space 10 during the turnaround motion. A suitable modified turnaround R21 can be calculated in a routing program by imposing a constraint on the range of allowed movements of the substrate table. The constraint can be a polygon 51 surrounding the substrate position.

Figure 5:
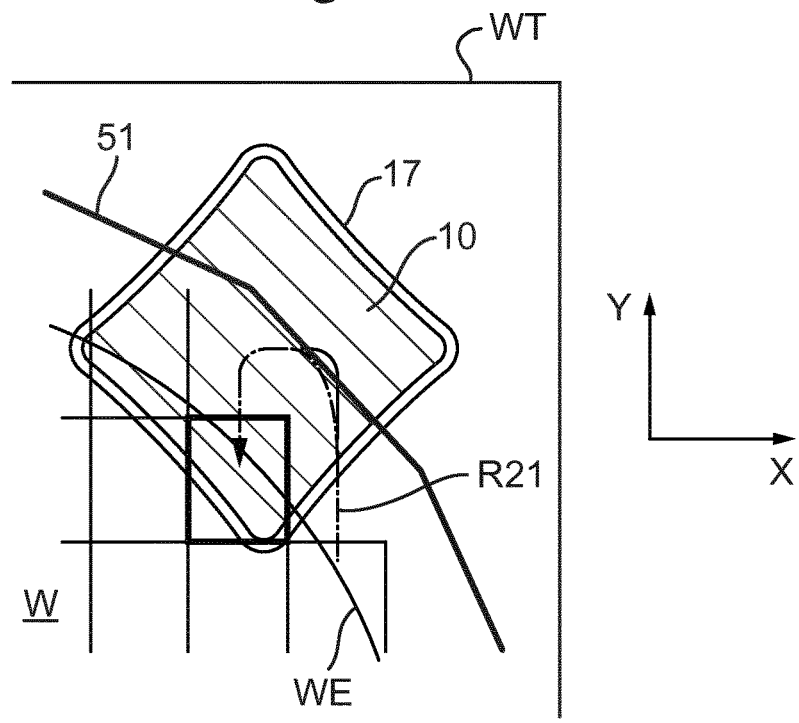
FIG. 5 depicts part of an exposure route in which the substrate turns around between exposures of edge target portions.
Figure 6:
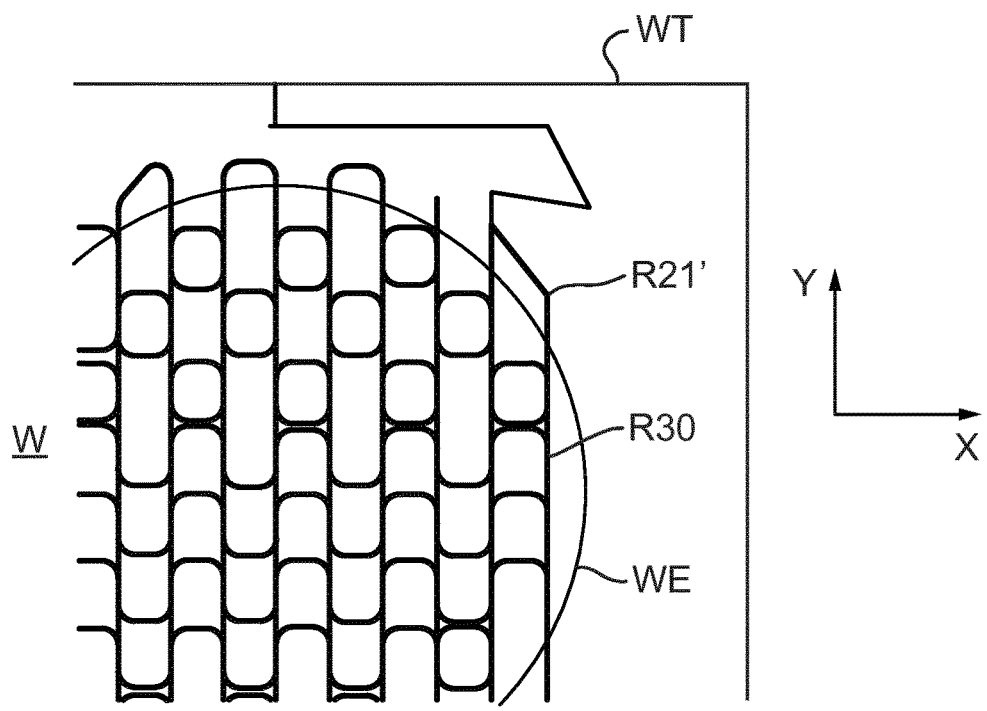
FIG. 6 depicts a part of an exposure route where the movement of the substrate table is constrained so that part of the immersion liquid continuously overlaps the substrate.

FIG. 6 illustrates another modified turnaround motion R21' in which the substrate table makes a turn and then a straight diagonal motion rather than a curved motion as shown in FIG. 5. FIG. 6 also shows the exposure route R30 for exposing a plurality of target portions.

However, the present inventors have discovered that, although an improvement on a conventional turnaround motion in some circumstances, modified turnaround motions R21 and R21' are not optimum in all circumstances. In particular, parts of the modified turnaround motions in which the substrate is moving along an extended curve or in a straight line at an angle to the X and Y direction are associated with a higher level of defects. It is believed this is because there is a higher risk of liquid loss onto the substrate when the substrate is moving in a direction approximately perpendicular to the trailing edge of the immersion space 10. This risk of liquid loss can be mitigated by reducing the speed of the substrate when it is moving in the directions associated with a higher risk of liquid loss. Of course, reducing the speed of the substrate reduces throughput.

Figure 7:
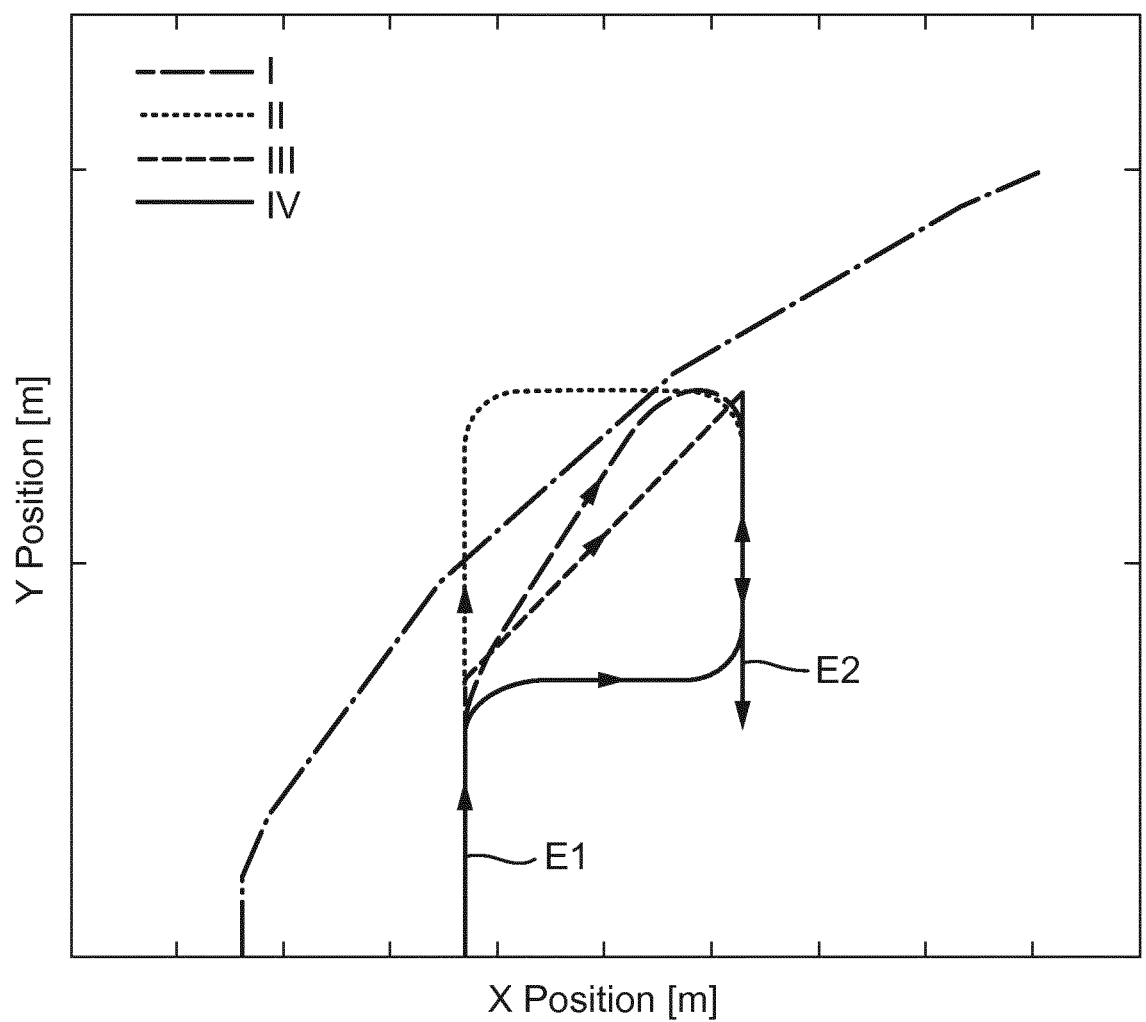
FIG. 7 depicts various options of a part of an exposure route adjacent an edge of the substrate.

FIG. 7 depicts several options for a transfer motion between exposures of two target portions that are close to the edge of the substrate. In FIG. 7 the lines indicated by line styles I to IV depict the movement of the centroid of the immersion space relative to the substrate, although as mentioned above in most cases the immersion space is still and the substrate moves. The dot-chain line represents a boundary which, if crossed by the centroid of the immersion space, means that the substrate edge will lose contact with the immersion space, i.e. the immersion space moves off the substrate.

In FIG. 7, the dotted line labelled II represents a part of a conventional "grid plan" route in which, after completing exposure movement E1, the substrate continues moving in the same direction (e.g. +Y) until it has moved nearly far enough in that direction to be lined up for the next exposure move E2. The substrate support then begins to decelerate in the scan direction and accelerate in the transverse direction (e.g. +X) and so makes a curved motion or turn. When the substrate support has reached a speed of 0 in the scan direction it continues to move in a straight line in the transverse direction until nearly aligned with the center line of the next target portion to be exposed. At this point the substrate support accelerates in the appropriate direction for scanned exposure of the next target portion, which in this example is opposite to the scan direction of exposure move E1, and decelerates in the transverse direction. Thus the substrate support makes another curved motion or turn onto the center line of the next target portion to be exposed. The substrate support may make a short "run-up" motion before beginning expose motion E2. The run-up motion allows the substrate support to be accelerated to scan speed and its speed fully stabilized before the exposure motion begins.

The conventional "grid plan" route is optimized for throughput by making the accelerations and decelerations as high as possible, so that the curved motions are as tight as possible and the transfer motions are as quick as possible. The "grid plan" route may be speed limited. Although the "grid plan" route can provide the highest throughput, it can be seen that the centroid of the immersion space crosses the boundary and the substrate edge will lose contact with the immersion space, i.e. the immersion space moves off the substrate. Therefore the "grid plan" route presents an increased risk of defects.

To avoid the substrate losing contact with the immersion space the dashed route III and long-dashed route I can be used. The dashed route III is referred to herein as the "diagonal" route and involves the substrate table making a rapid acceleration in the transverse direction shortly after the end of the exposure motion E1 so that it follows a diagonal line to reach the position for the start of the run-up to exposure motion E2. The long-dashed route I is referred to herein as the "long-curve" route and involves lower accelerations and decelerations so that more gentle curved motions after the end of the first exposure motion and before the run-up motion are performed. The diagonal route travels closer to the center of the substrate and so reduces the chance of the immersion space moving off the substrate but the risk of defects can be higher due to the increased speeds in the diagonal movement.

In an embodiment of the present invention a new route, referred to herein as an "inner-curve" route, is proposed. An example is depicted by the solid line IV in FIG. 7. In an embodiment of the invention a first curved motion is performed directly after the end of the first exposure motion E1. Then a transverse motion in which the substrate support moves in the transverse direction, i.e. perpendicular to the scan direction, is performed. The first transverse motion ends with a second curved motion to bring the substrate onto the correct line for the second expose motion E2 and stationary in the transfer direction. A second transverse motion in which the substrate table moves in the scan direction to an appropriate position to begin the second exposure motion is performed, with or without the run-up motion. The first curved motion, second curved motion, the first transverse motion and second transverse motion together form a transfer motion. The inner curve route can be generated by a route generator by applying the constraint that, after exposing an edge target portion with a scan direction towards the substrate edge, a curved motion or turn towards the interior of the substrate occur as soon as possible after exposure of that edge target portion. Conversely, after exposing an edge target portion with a scan direction away from the substrate edge, the curved motion should occur as late as possible.

Desirably the first curved motion is performed directly, i.e. as soon as possible, after the end of the exposure motion. The end of the exposure motion can be defined as the end of exposure of the device layer and any adjacent scribe lane marks. The end of the exposure motion might be marked by the turning-off of the projection beam at substrate level. The projection beam can be turned-off by stopping the beam source. Alternatively or in addition the beam can be turned-off at substrate level by closing masking blades, e.g. REMA blades, that control illumination of the patterning device. A short follow-through motion, in which the substrate table continues to move in the scanning direction at the scanning speed, can be provided at the end of the exposure motion. The follow-through motion ensures that initiation of a subsequent motion does not disturb the end of the exposure motion.

In an embodiment, the first curved motion is performed as soon after the end of the exposure motion as is necessary to ensure that the substrate remains in contact with the immersion space throughout the transfer motion between exposure motions. It will be understood from FIG. 7 that the position of the end of the first exposure motion, which is determined by the position of the respective target portion, relative to the edge of the substrate determines the amount of distance that can be travelled in the scan direction before the first curved motion begins without the substrate losing contact with the immersion space. Nevertheless, it is desirable that the curved motion begin as soon as possible after the end of the exposure motion so as to minimize the area of the immersion space that goes off the substrate.

In an embodiment, the first curved motion is started within 1%, within 5% or within 10% of the time taken for an exposure motion for a whole target portion, e.g. within 10 ms. In an embodiment, the first curved motion is started before the substrate has travelled more than 1%, more than 5% or more than 10% of the length of a whole target portion, e.g. not more than 3 mm In other circumstances, the first curved motion is performed as late as possible before the next exposure motion E2. In general, the timing of the first curved motion is selected to ensure that the substrate does not lose contact with the immersion space. In other words, the edge of the substrate does not move out from underneath the immersion liquid. Performing the first curved motion as late as possible may still allow for a constant speed motion in the scan direction before the next scan to allow for settling of a servo control system.

In an embodiment, the starts and ends of periods of acceleration and deceleration in the scan direction and transverse direction are synchronised. For example, an acceleration in the transverse direction begins and ends simultaneously with a deceleration in the scan direction.

In an embodiment of the invention, the substrate support is positionable in six degrees of freedom— e.g. X, Y, Z, Rx, Ry, Rz— by the second positioner PW. The degree of freedom Rn denotes rotation about an axis parallel to the direction N. The route of the present invention relates only to positioning of the substrate in the X-Y plane, i.e. a plane containing the X and Y directions. Movements in the other degrees of freedom may be superimposed on the route of the present invention, e.g. to compensate for distortions of the substrate and/or the plane of best focus of the projection system.

The second positioner PW may be divided into a long stroke module that effects relatively long range but relatively low precision movements in X and Y directions and a short stroke module that effects relatively short range but relatively high precision movements in all six degrees of freedom. The route of the present invention can be effected by the long stroke module, with corrective movements by the short stroke module superimposed.

The long stroke module may be divided into a scan direction drive (also referred to as a Y-drive) and a transverse direction drive (also referred to as an X-drive). In an embodiment, linear motors are used in an arrangement known as an H-drive. In a route of an embodiment, a motion described as "in the scan direction" can be performed by activating only the scan direction drive. Similarly, a motion described as "in the transverse direction" can be performed by activating only the transverse direction drive.

In an embodiment, the long stroke module comprises a planar motor which has a plurality of coils set at angles to the X and Y directions acting against a two-dimensional array of magnets. The coils may be provided in the moving part (forcer) and the magnets in the static part (stator) or vice versa. Movement in different directions is controlled by controlling the phases of the currents in the different coils so that it is not possible to separate the planar motor into parts responsible for effecting movement in different directions. Therefore the whole planar motor will be active even if motion in only one direction is being performed.

In an embodiment of the invention, movement in a specified direction should be considered to encompass movement in a direction within 5 degrees, desirably 2 degrees, of the specified direction.

Figure 8:
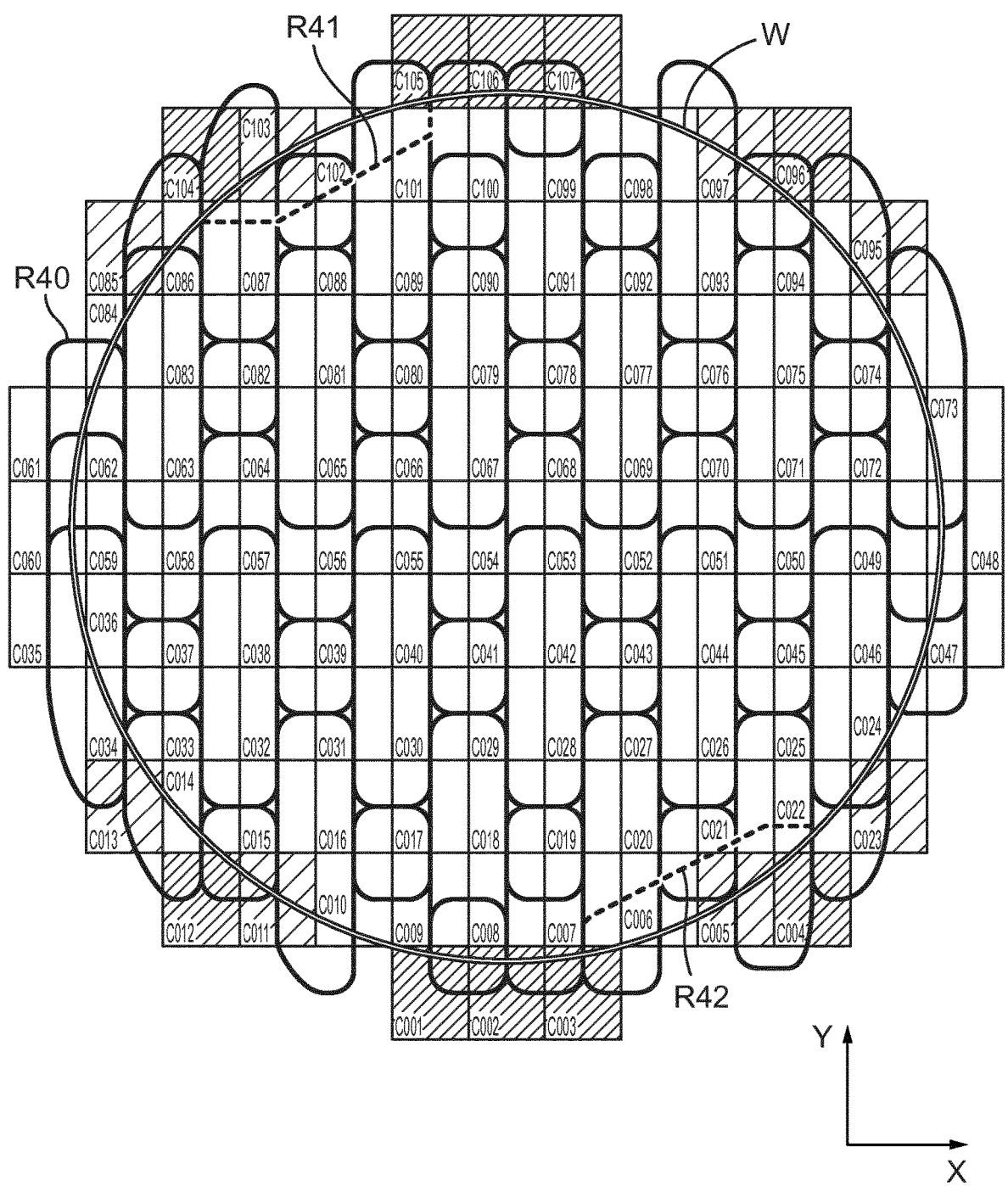
FIG. 8 depicts an exposure route for a whole substrate in which a risk of trail defects occurs.

FIG. 8 depicts a route R40 for exposure of target portions C001 to C107 on a substrate. The target portions are exposed in the numbered order. Target portions depicted with dense hatching, e.g. C104, are edge target portions that are exposed at a low speed. Target portions depicted with light hatching, e.g. C085, are edge target portions that are exposed at a low speed, but faster than the densely hatched target portions. Edge target portions are exposed but the exposure motion covers only the part of the target portion that overlaps the substrate, not the full length of the edge target portion. Route R40 has been calculated by optimizing for throughput and includes long diagonal motions R41, R42. Diagonal motions R41, R42 are transfer moves between the exposure of a target portion at the end of one row and the exposure of the target portion at the beginning of the next. Diagonal motion R41 comes after exposure of edge target portion C104 and repositions the substrate for exposure of edge target portion C105. Diagonal motion R42 comes after exposure of edge target portion C003 and repositions the substrate for exposure of edge target portion C004.

When optimized for throughput, diagonal motions R41, R42 include movements at a higher speed than the maximum immersion speed leading to an increased risk of defects due to loss of immersion liquid onto the substrate. The speed of movement of the substrate needs to be limited during these motions, leading to a throughput loss.

Figure 9:
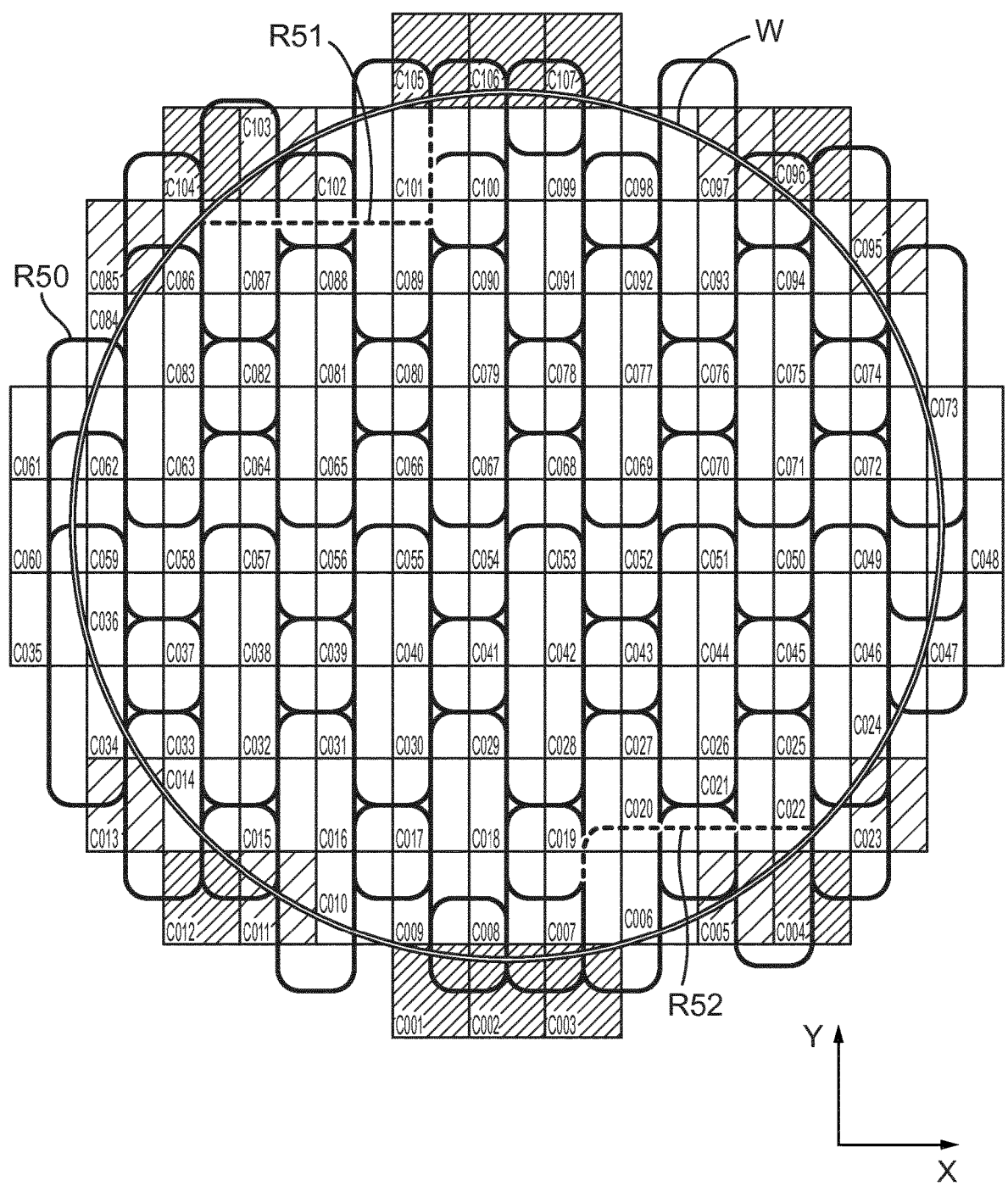
FIG. 9 depicts an exposure route for a whole substrate according to an embodiment of the invention.

FIG. 9 depicts a route R50 according to an embodiment of the invention for exposing the same arrangement of target portions as in FIG. 8. Route R50 is generated by applying the constraints that:

straight line motions must be in the scan (+/−Y) or transverse (+/−X) directions
straight line motions are joined by curved motions
no direction dependent velocity constraint is applied.

Route R50 therefore replaces the long diagonal movements between the end of a row and the beginning of the nest row with L-shaped motions R51, R52 essentially consisting of motions in the scan and transverse directions joined by curve motions. Route R50 provides maximum throughput with minimum risk of defects due to liquid loss from the immersion space. It will be noted that in route R50 the turnaround moves after exposures of edge target portions conform to the general "grid plan" and may therefore involve the substrate W losing contact with the immersion space. If so, the additional constraint that a curved motion or turn towards the interior of the substrate occur as soon as possible after exposure of an edge target portion, as discussed above with reference to FIG. 7, can be applied.

Figure 10:
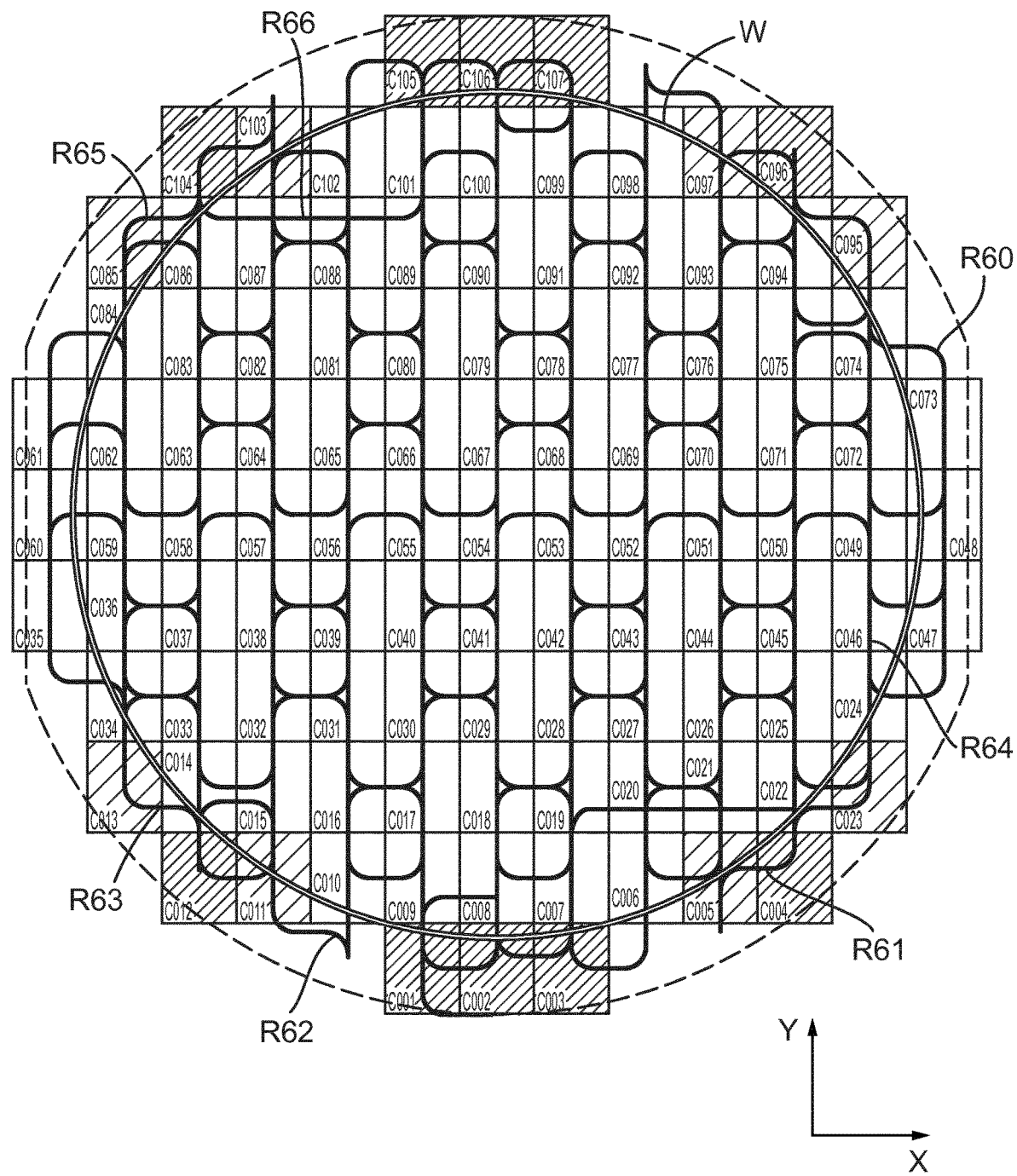
FIG. 10 depicts another exposure route for a whole substrate according to an embodiment of the invention.

FIG. 10 depicts a route R60 to expose a whole substrate that has been generated by applying the constraints according to the invention. The same hatching convention as used in FIG. 9 is applied, i.e. dense hatching indicates a slower exposure speed for that target portion.

It will be seen that route R60 includes long transverse motions between exposures of an edge target portion at the end of one row and an edge target portion at the beginning of the next. See for example movement R66 between target portion C104 and target portion C105.

In route R60 are several examples of an "as soon as possible" transverse motion: R61 between target portions C004 and C005; R62 between target portions C010 and C011; R63 between target portions C012 and C013; and R65 between target portions C085 and C086.

Between target portions C023 and C024, which are in the same column, no transverse motion is necessary. Instead, after exposure of target portion C023 the substrate keeps moving in the scan direction (+Y) across the whole width of target portion C024 and beyond. The substrate then reverses direction at R64 to expose target portion C024.

The above constraints can also be applied to movements of the substrate support which do not involve contact between the substrate and the immersion space. An example is described below with reference to FIG. 11.

Before and/or after exposure of a substrate it is often desirable to make measurements of the projection beam. For example two image sensors, e.g. transmission image sensors, may be used to measure the relationship between the plane of best focus of the projection system and the substrate support in order to align the substrate to the projected image. To make such a measurement, the substrate support is moved to position a first image sensor 61 in the plane of best focus of the projection system and a measurement is made. The substrate support is then moved to position a second image sensor 62 in the plane of best focus and a second measurement is made. The first image sensor 61 and the second image sensor 62 may be on opposite sides of the substrate W. In moving between first image sensor 61 and the second image sensor 62 it is desirable that the immersion space not contact the substrate W in order to avoid the possibility that immersion liquid is left on the substrate. Therefore the substrate support WT must be moved so that the immersion space goes around the substrate W.

Figure 11:
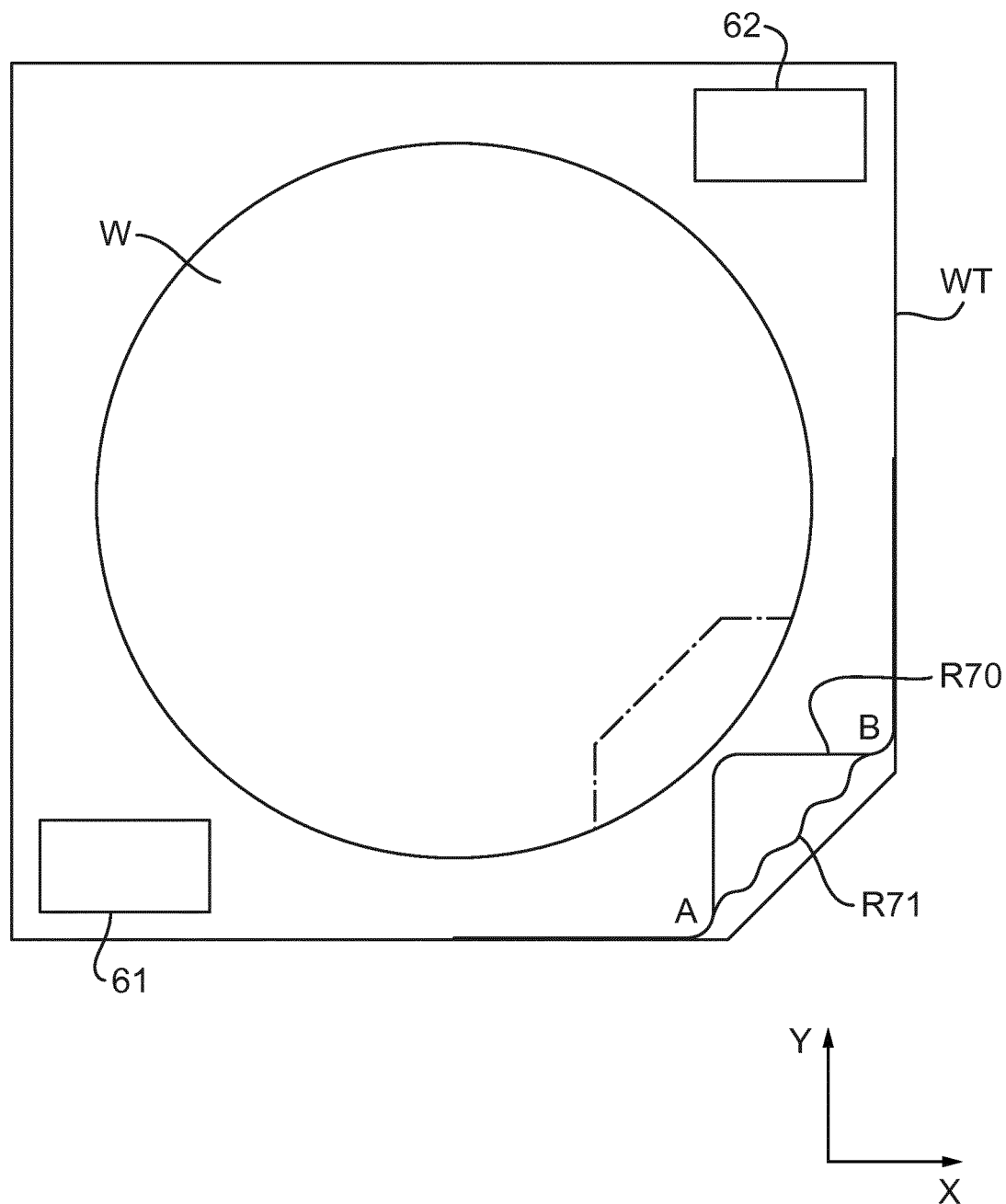
FIG. 11 depicts a route for a substrate between sensors.

As shown in FIG. 11 the substrate support WT is generally rectangular with a cut-off corner. Therefore a simple L-shaped movement cannot be used to go from first image sensor 61 to second image sensor 62. R70 shows a first route that avoids the immersion space going off the edge of the substrate support, but this results in the immersion space coming into contact with the substrate W. Therefore in an embodiment an alternative move R71 is used. This alternative move has a sequence of curved motions and linear motions in the scan direction and transverse direction, thus satisfying the above constraints whilst maintaining high throughput.

In an embodiment, a computer program computes an optimal set of routing instructions including any or all of reduced speed scans, modified turnaround motions, cleaning moves and scan direction changes, taking account of the probability of liquid loss to maximize yield.

The prediction of loss of immersion liquid, the generation of additional cleaning moves and the generation of modified routing instructions can be performed by a control system or computer incorporated in the lithography apparatus or by one or more separate computers. These steps of the method can be performed in advance of the production exposures or just in time during exposures. Modified routing instructions can be generated once and applied to a plurality of substrates that are to be exposed with the same recipe.

In an embodiment, instructions to calculate or perform the exposure routes may take the form of a computer program containing one or more sequences of machine-readable instructions describing a method as disclosed above, or a data storage medium (e.g. semiconductor memory, magnetic or optical disk) having such a computer program stored therein. The computer program can be applied as an upgrade to an existing lithography apparatus.

In an embodiment, there is provided a lithographic apparatus for exposing a patterned beam onto target portions of a substrate, the apparatus comprising: a projection system configured to project a patterned beam and having a final optical element; a substrate support configured to support a substrate in the patterned beam; a liquid confinement structure configured to confine a liquid to an immersion space between the final optical element and the substrate; a positioning device configured to position the substrate support and thereby the substrate; and a controller configured to control the positioning device so that the substrate support follows a route comprising: a first exposure motion during which the substrate is moved at a constant speed in a first direction; a first transit motion during which the substrate is accelerated in a second direction orthogonal to the first direction and decelerated in the first direction; a second transit motion during which the substrate's motions in a plane containing the first and second directions are only in the second direction; a third transit motion during which the substrate accelerates in the first direction and decelerates in the second direction; a fourth transit motion in which the substrate's movements in the plane containing the first and second directions are only parallel to the first direction; and a second exposure motion during which the substrate is moved at a constant speed in a direction parallel to the first direction.

In an embodiment, the controller is configured to begin the first transit motion directly after the end of the first exposure motion, or wherein the controller is configured to begin the first transit motion within a predetermined duration after the end of the first exposure motion, the predetermined duration being less than 1%, less than 5% or less than 10% of the time taken for an exposure motion to expose a whole target portion, or wherein the controller is configured to begin the first transit motion before the substrate has moved more than a predetermined distance from the end of the first exposure motion, the predetermined distance being less than 1%, less than 5% or less than 10% of the length of a whole target portion. In an embodiment, the controller is configured to move the substrate in a curved path throughout the first transit motion, and/or wherein the controller is configured to move the substrate in a curved path throughout the third transit motion. In an embodiment, the speed of the substrate when moving along the curved path is greater than the speed of the substrate when moving in the first or second direction, or wherein the speed of the substrate when moving along the curved path is not greater than the speed of the substrate when moving in the first or second direction. In an embodiment, the controller is configured to move the substrate in third direction during the second exposure motion, the third direction being opposite to the first direction.

In an embodiment, there is provided a method of manufacturing a device using a lithographic apparatus for exposing a patterned beam onto target portions of a substrate, the apparatus comprising: a projection system configured to project a patterned beam and having a final optical element; a substrate support configured to support a substrate in the patterned beam; a liquid confinement structure configured to confine a liquid to an immersion space between the final optical element and the substrate; and a positioning device configured to position the substrate support and thereby the substrate; the method comprising: a first exposure motion during which the substrate is moved at a constant speed in a first direction; a first transit motion during which the substrate is accelerated in a second direction orthogonal to the first direction and decelerated in the first direction; a second transit motion during which the substrate's movements in a plane containing the first and second directions are only in the second direction; a third transit motion during which the substrate accelerates in the first direction and decelerates in the second direction; a fourth transit motion in which the substrate's movements in the plane containing the first and second directions are only parallel to the first direction; and a second exposure motion during which the substrate is moved at a constant speed in a direction parallel to the first direction.

In an embodiment, the controller is configured to begin the first transit motion directly after the end of the first exposure motion, or wherein the controller is configured to begin the first transit motion within a predetermined duration after the end of the first exposure motion, the predetermined duration being less than 10% of the time taken for an exposure motion to expose a whole target portion, or wherein the controller is configured to begin the first transit motion before the substrate has moved more than a predetermined distance from the end of the first exposure motion, the predetermined distance being less than 10% of the length of a whole target portion. In an embodiment, the controller is configured to move the substrate in a curved path throughout the first transit motion, and/or wherein the controller is configured to move the substrate in a curved path throughout the third transit motion. In an embodiment, the speed of the substrate when moving along the curved path is greater than the speed of the substrate when moving in the first or second direction, or wherein the speed of the substrate when moving along the curved path is not greater than the speed of the substrate when moving in the first or second direction. In an embodiment, the controller is configured to move the substrate in third direction during the second exposure motion, the third direction being opposite to the first direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

The terms "radiation" and "beam" used herein encompass all types of electromagnetic radiation, including ultraviolet (UV) radiation (e.g. having a wavelength of or about 436, 405, 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage media for storing such computer programs, and/or hardware to receive such media. So the controller(s) may operate according the machine readable instructions of one or more computer programs.

A liquid supply system as contemplated herein should be broadly construed. In certain embodiments, it may be a mechanism or combination of structures that provides an immersion liquid to a space between the projection system and the substrate and/or substrate table. It may comprise a combination of one or more structures, one or more fluid openings including one or more liquid openings, one or more gas openings or one or more openings for two phase flow. The openings may each be an inlet into the immersion space (or an outlet from a fluid handling structure) or an outlet out of the immersion space (or an inlet into the fluid handling structure). In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the immersion liquid.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
    a projection system configured to project a patterned beam and having a final optical element;
    a substrate support configured to support a substrate in the patterned beam;
    a liquid confinement structure configured to at least partly confine a liquid to an immersion space between the final optical element and the substrate;
    a positioning device configured to position the substrate support and thereby the substrate; and
    a controller configured to control the positioning device so that the substrate support follows a route comprising:
    a first exposure motion during which the substrate is moved at an essentially constant speed in a first direction;
    a transfer motion performed after the end of the first exposure motion, wherein the substrate is not exposed to the patterned beam during the transfer motion; and
    a next second exposure motion during which the substrate is moved at an essentially constant speed in a direction parallel to the first direction,
    wherein the transfer motion comprises:
        a first transit motion during which the substrate is accelerated in a second direction orthogonal to the first direction and decelerated in the first direction; and subsequently
        a second transit motion during which the substrate is displaced and the substrate's motions in a plane containing the first and second directions are only in the second direction; and subsequently
        a third transit motion during which the substrate accelerates in the first direction and decelerates in the second direction; and subsequently
        a fourth transit motion in which the substrate is displaced and the substrate's movements in the plane containing the first and second directions are only parallel to the first direction.

2. The lithographic apparatus according to claim 1, wherein the controller is configured to begin the first transit motion directly after the end of the first exposure motion.

3. The lithographic apparatus according to claim 1, wherein the controller is configured to move the substrate in a curved path throughout the first transit motion, and/or wherein the controller is configured to move the substrate in a curved path throughout the third transit motion.

4. The lithographic apparatus according to claim 3, wherein the speed of the substrate when moving along the curved path is greater than the speed of the substrate when moving in the first or second direction.

5. The lithographic apparatus according to claim 1, wherein the controller is configured to begin the first transit motion within a predetermined duration after the end of the first exposure motion, the predetermined duration being less than 10% of the time taken for an exposure motion to expose a whole target portion.

6. The lithographic apparatus according to claim 1, wherein the controller is configured to begin the first transit motion before the substrate has moved more than a predetermined distance from the end of the first exposure motion, the predetermined distance being less than 10% of the length of a whole target portion.

7. The lithographic apparatus according to claim 1, wherein the controller is configured to provide the deceleration in the first transit motion in the positive first direction and to provide the acceleration in the third transit motion in the positive first direction.

8. A method of manufacturing a device using a lithographic apparatus, the method comprising:
    using a projection system of a lithographic apparatus to project a patterned beam and having a final optical element;
    using a substrate support to support a substrate in a path of the patterned beam;
    using a liquid confinement structure to at least partly confine a liquid to an immersion space between the final optical element and the substrate; and
    using a positioning device to position the substrate support and thereby the substrate, the positioning of the substrate support comprising:
    performing a first exposure motion during which the substrate is moved at an essentially constant speed in a first direction;
    performing a transfer motion after the end of the first exposure motion, wherein the substrate is not exposed to the patterned beam during the transfer motion; and
    performing a next second exposure motion during which the substrate is moved at an essentially constant speed in a direction parallel to the first direction, wherein the transfer motion comprises:
a first transit motion during which the substrate is accelerated in a second direction orthogonal to the first direction and decelerated in the first direction;
a second transit motion during which the substrate is displaced and the substrate's movements in a plane containing the first and second directions are only in the second direction;
a third transit motion during which the substrate is displaced and the substrate accelerates in the first direction and decelerates in the second direction;
a fourth transit motion in which the substrate's movements in the plane containing the first and second directions are only parallel to the first direction.

9. The method according to claim 8, wherein the first transit motion begins directly after the end of the first exposure motion.

10. The method according to claim 8, comprising moving the substrate in a curved path throughout the first transit motion, and/or moving the substrate in a curved path throughout the third transit motion.

11. The method according to claim 10, wherein the speed of the substrate when moving along the curved path is greater than the speed of the substrate when moving in the first or second direction.

12. The method according to claim 8, wherein the substrate moves in a third direction during the second exposure motion, the third direction being opposite to the first direction.

13. The method according to claim 8, wherein the first transit motion begins within a predetermined duration after the end of the first exposure motion, the predetermined duration being less than 10% of the time taken for an exposure motion to expose a whole target portion.

14. The method according to claim 8, wherein the first transit motion begins before the substrate has moved more than a predetermined distance from the end of the first exposure motion, the predetermined distance being less than 10% of the length of a whole target portion.

15. The method according to claim 8, comprising providing the deceleration in the first transit motion in the positive first direction and providing the acceleration in the third transit motion in the positive first direction.

16. A lithographic apparatus comprising:
a projection system configured to project a patterned beam and having a final optical element;
a substrate support configured to support a substrate in the patterned beam;
a liquid confinement structure configured to at least partly confine a liquid to an immersion space between the final optical element and the substrate;
a positioning device configured to position the substrate support and thereby the substrate; and
a controller configured to control the positioning device so that the substrate support follows a route comprising:
a first exposure motion during which the substrate is moved at an essentially constant speed in a first direction;
a transfer motion performed after the end of the first exposure motion, wherein the substrate is not exposed to the patterned beam during the transfer motion, and
a next second exposure motion during which the substrate is moved at an essentially constant speed in a direction opposite to the first direction,
wherein the transfer motion comprises:
a first transit motion during which the substrate is accelerated in a second direction orthogonal to the first direction and decelerated in the first direction; and subsequently
a second transit motion during which the substrate is displaced and the substrate's motions in a plane containing the first and second directions are only in the second direction; and subsequently
a third transit motion during which the substrate accelerates in the first direction and decelerates in the second direction; and subsequently
a fourth transit motion in which the substrate is displaced and the substrate's movements in the plane containing the first and second directions are only parallel to the first direction.

17. The lithographic apparatus according to claim 16, wherein the controller is configured to begin the first transit motion directly after the end of the first exposure motion.

18. The lithographic apparatus according to claim 16, wherein the controller is configured to begin the first transit motion within a predetermined duration after the end of the first exposure motion, the predetermined duration being less than 10% of the time taken for an exposure motion to expose a whole target portion.

19. The lithographic apparatus according to claim 16, wherein the controller is configured to begin the first transit motion before the substrate has moved more than a predetermined distance from the end of the first exposure motion, the predetermined distance being less than 10% of the length of a whole target portion.

20. The lithographic apparatus according to claim 16, wherein the controller is configured to move the substrate in a curved path throughout the first transit motion, and/or wherein the controller is configured to move the substrate in a curved path throughout the third transit motion.

21. The lithographic apparatus according to claim 20, wherein the speed of the substrate when moving along the curved path is greater than the speed of the substrate when moving in the first or second direction.

22. A non-transitory computer-readable medium comprising computer-readable medium instructions thereon that, when executed by a computer system, are configured to cause the computer system to cause at least:
performance of a first exposure motion during which a substrate in a lithographic apparatus is moved at an essentially constant speed in a first direction and the substrate is exposed to a patterned radiation beam from a projection system of the lithographic apparatus;
performance of a transfer motion after the end of the first exposure motion, wherein the substrate is not exposed to the patterned beam during the transfer motion; and
performance of a next second exposure motion during which the substrate is moved at an essentially constant speed in a direction parallel to or opposite to the first direction and the substrate is exposed to the patterned radiation beam,
wherein the transfer motion comprises:
a first transit motion during which the substrate is accelerated in a second direction orthogonal to the first direction and decelerated in the first direction;
a second transit motion during which the substrate is displaced and the substrate's movements in a plane containing the first and second directions are only in the second direction;
a third transit motion during which the substrate accelerates in the first direction and decelerates in the second direction;

a fourth transit motion in which the substrate is displaced and the substrate's movements in the plane containing the first and second directions are only parallel to the first direction, and wherein, during the first exposure motion, the transfer motion and the second exposure motion, a liquid confinement structure is configured to at least partly confine a liquid to an immersion space between the projection system and the substrate.

23. The computer-readable medium according to claim 22, wherein the instructions are configured to provide the deceleration in the first transit motion in the positive first direction and to provide the acceleration in the third transit motion in the positive first direction.

\* \* \* \* \*